United States Patent
Oka

[19]

[11] Patent Number: 5,891,540
[45] Date of Patent: Apr. 6, 1999

[54] ADHESIVE TAPE FOR ELECTRONIC PARTS

[75] Inventor: Osamu Oka, Shizuoka, Japan

[73] Assignee: Tomoegawa Paper Co., Ltd., Tokyo, Japan

[21] Appl. No.: 966,194

[22] Filed: Nov. 7, 1997

[30] Foreign Application Priority Data

Nov. 14, 1996 [JP] Japan ................................. 8-302599

[51] Int. Cl.$^6$ .................................................... B32B 7/12
[52] U.S. Cl. .................. 428/40.1; 428/41.5; 428/41.8; 428/41.9; 428/212; 428/214; 428/447; 428/473.5; 524/99
[58] Field of Search ................................ 428/40.1, 41.5, 428/41.8, 41.9, 212, 214, 447, 473.5; 524/99

[56] References Cited

U.S. PATENT DOCUMENTS 4,063,984  12/1977  Critchley ........................... 428/473.5

FOREIGN PATENT DOCUMENTS 8-325533  12/1996  Japan .
9-67559   3/1997   Japan .

*Primary Examiner*—Nasser Ahmad
*Attorney, Agent, or Firm*—McDermott, Will & Emery

[57] ABSTRACT

This invention provide an adhesive tape and a liquid adhesive for electronic parts having sufficient thermal resistance and reliability. The adhesive tape comprises an adhesive layer composed of at least a polyimide comprising the repeating units represented by the formulas (1) and (2), provided on surface of a heat resistance film or a release film:

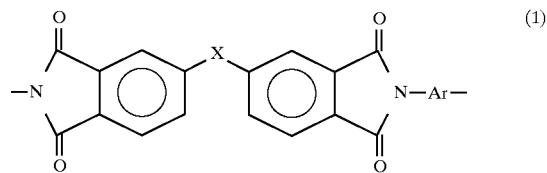

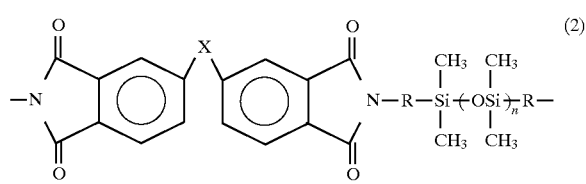

wherein X is $-SO_2-$ and/or $-C(=O)-OCH_2CH_2O-C(=O)-$, Ar is a divalent group containing aromatic rings, and R is an alkylene group having 1 to 10 carbon atoms or $-CH_2OC_6H_4-$, and n means an integer of 1 to 20.

4 Claims, 2 Drawing Sheets

ADHESIVE TAPE FOR ELECTRONIC PARTS

BACKGROUND OF THE INVENTION

1) Field of the Invention

The present invention relates to adhesive tapes for electronic parts to be used for adhering between parts around leadframes making up a semiconductor device, e.g., lead pins, semiconductor chip mounted substrates, heat spreader, semiconductors themselves.

2) Description of the Related Art

Conventionally, adhesive tapes for fixing a leadframe, TAB tapes, etc., are used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a semiconductor chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength at room temperature immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage.

In recent years, resin-molded type semiconductor devices as shown in FIGS. 1 to 3 have been developed or produced. In FIG. 1, the device has a construction in which lead pins 3 and plane 2 are connected by means of an adhesive layer 6, a semiconductor chip 1 is mounted on the plane 2, and together with bonding wires 4 between the semiconductor chip 1 and the lead pins 3, they are molded with a resin 5. In FIG. 2, the device has a construction in which the lead pins 3 on the leadframe are fixed with the semiconductor chip 1 and an adhesive layer 6 and together with a bonding wire 4, they are molded with a resin 5. In FIG. 3, the device has a construction in which a semiconductor chip 1 is mounted on a die pad 7, electrode 8 is fixed with an adhesive layer 6, the spaces between semiconductor chip 1 and an electrode 8 and between the electrode 8 and lead pins 3 are each connected with bonding wires 4, and they are molded with a resin 5.

In the adhesive layer in the resin-molded type semiconductor devices shown in FIGS. 1 to 3, the use of an adhesive tape to which a conventional adhesive is applied has the problems that the generated gas stains the lead to cause deterioration of the adhesive strength or causes generation of package crack, because of insufficient heat resistance. It is therefore required to develop adhesives for electronic parts having sufficient heat resistance and reliability and adhesive tapes for electronic parts using them.

The present inventor has solved before the above problems by inventing adhesive tapes using an adhesive containing a polyimide composed of repeating units represented by the below-described formulas (1a) and (2b). (Japanese Patent Application Laid-open Nos. 325533/1996 and 67559/1997).

These adhesive tapes however have various problems. For example, there is a problem of easily causing interfacial separation of the adhesive layer from the heat resistant film in the case that the adhesive layer is formed on the heat resistant film. In particular, the interfacial separation at high humidity and high temperature becomes a serious problems because of causing remarkable deterioration of reliability of semiconductor packages. In the case of an adhesive tape consisting only of an adhesive layer, there is the problem that insulation becomes difficult to assure when the tape is bonded under pressure with heat, because the leadframe is embedded in and pierces the adhesive layer. Further, in a case of producing the package shown in FIG. 2, it is necessary the adhesive layer on the leadframe does not soften when the semiconductor tip is bonded under pressure with heat, though there is a requirement of lowering the adhesion temperature of the leadframe as low as possible.

The present invention has been made for the purpose of solving such problems in the prior arts. Namely, an object of the present invention is to provide an adhesive tape for electronic parts capable of adhesion at a relatively low temperature, with keeping electrical insulation and having sufficient reliability.

SUMMARY OF THE INVENTION

The adhesive tape for electronic parts of the present invention is characterized by comprising two adhesive layers which are composed of 100–40% by mol of at least a polyimide comprising at least one of the repeating units represented by the following formulas (1a) and (1b) and 0–60% by mol of at least one of the repeating units represented by the following formulas (2a) and (2b), said two adhesive layers being laminated each other and having each a different glass transition temperature:

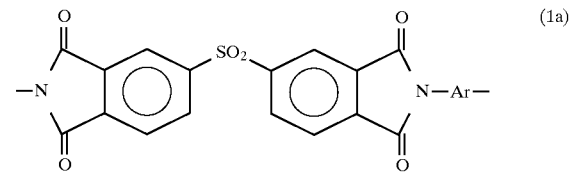

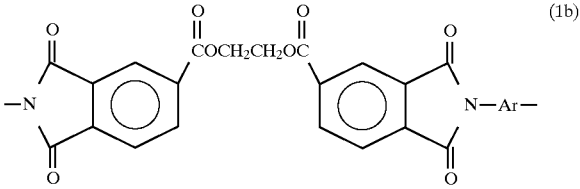

wherein Ar represents a divalent group selected from the following formulas containing aromatic rings:

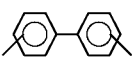

,

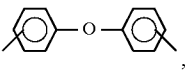

,

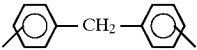

-continued

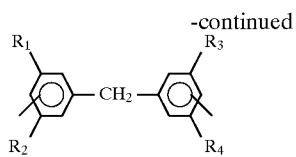

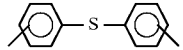

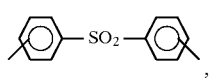

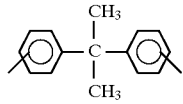

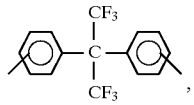

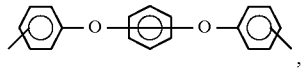

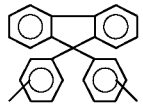

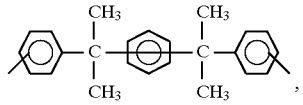

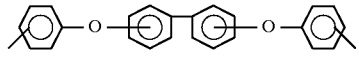

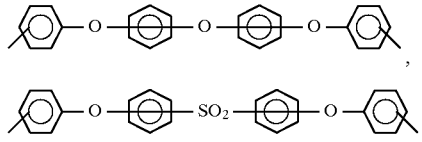

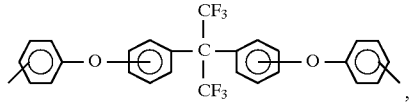

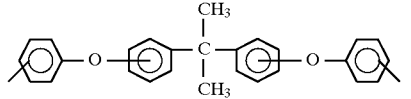

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time.

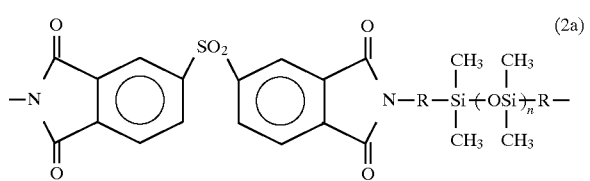
(2a)

-continued

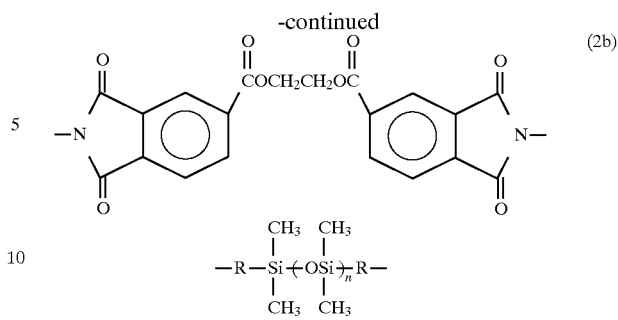
(2b)

wherein R is an alkylene group having 1 to 10 carbon atoms or —$CH_2OC_6H_4$—, the methylene group of which attaches to Si, and n means an integer of 1 to 20.

In the adhesive tape for electronic parts of the present invention, two adhesive layers which are laminated each other and have each a different glass transition temperature mean those which are composed of an adhesive layer having a higher glass transition temperature and a lower glass transition temperature. It is preferred that the difference of the glass transition temperature of these two adhesive layers is at least 40° C.

In the adhesive tape for electronic parts of the present invention, it is preferred that at least one of the adhesive layers contains a filler having a particle size of not more than 1 μm in an amount of from 0.1 to 50% by weight and it is possible to provide a releasing film on a surface of at least one of the adhesive layers.

DETAILED DESCRIPTION OF PREFERRED EMBODIMENTS

Figure 1:
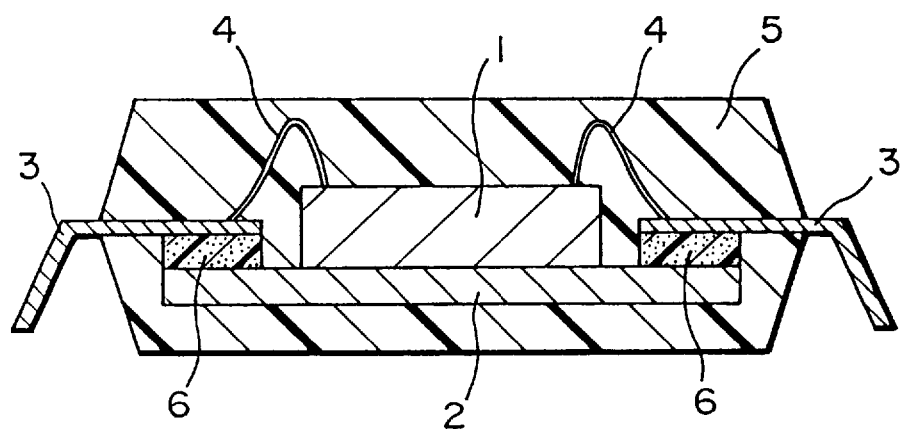
FIG. 1 is a cross-sectional view of one embodiment of a resin-molded type semiconductor device using an adhesive tape of the present invention or a conventional adhesive tape.
Figure 2:
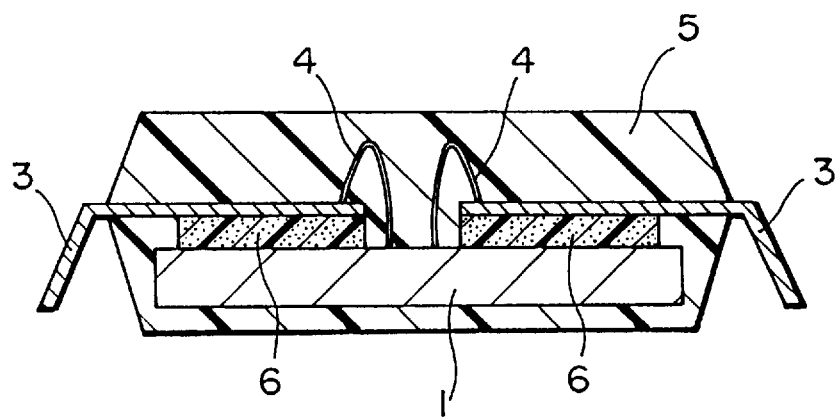
FIG. 2 is a cross-sectional view of another embodiment of a resin-molded type semiconductor device using an adhesive tape of the present invention or a conventional adhesive tape.
Figure 3:
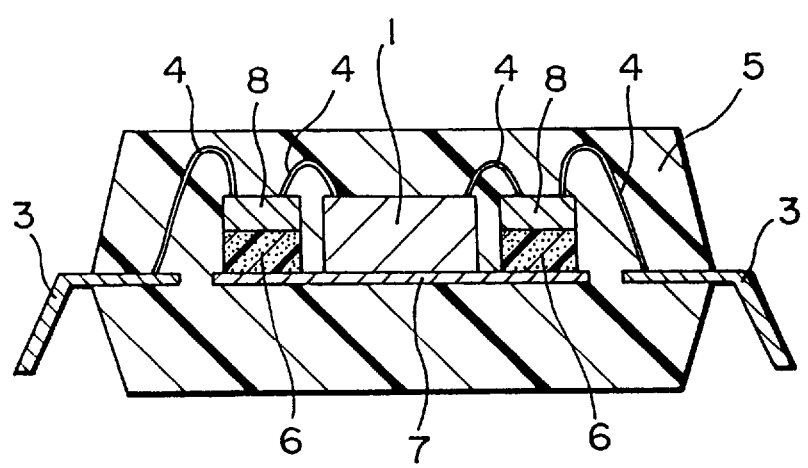
FIG. 3 is a cross-sectional view of still another embodiment of a resin-molded type semiconductor device using an adhesive tape of the present invention or a conventional adhesive tape.

The embodiments of the present invention will now be described in detail.

The adhesive tape for electronic parts of the present invention have two adhesive layers containing at least one kind of polyimides. In the following, polyimides used for the adhesive layers are illustrated.

The polyimides used in the present invention are those which contain 100–40% by mol of at least one of repeating units represented by the following formulas (1a) and (1b). In this case, the polyimide contains "at least one of the repeating units represented by the formulas (1a) and (1b)" includes polyimides containing the repeating unit represented by the formula (1a) alone, polyimides containing the repeating unit represented by the formula (1b) alone, and polyimides containing both the repeating units represented by the formulas (1a) and (1b).

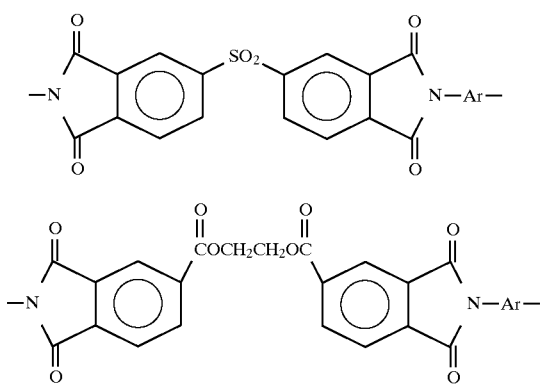

wherein Ar is the same meaning as described above.

The polyimides used in the present invention are those which contain 0–60% by mol of at least one of repeating units represented by the following formulas (2a) and (2b). In this case, the polyimide contains "at least one of the repeating units represented by the formulas (2a) and (2b)" includes polyimides containing the repeating unit represented by the formula (2a) alone, polyimides containing the repeating unit represented by the formula (2b) alone, and polyimides containing both the repeating units represented by the formulas (2a) and (2b).

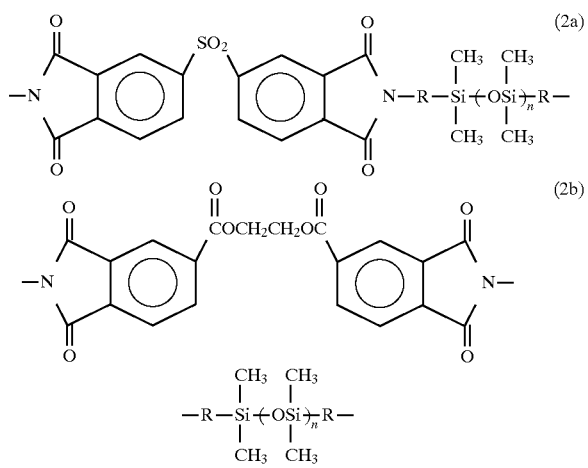

wherein R and n are each the same meaning as described above.

In the above described polyimide, the greater the proportion of the repeating units represented by the formulas (1a) and (1b) (referred to as [(1a)+(1b)]hereinafter) is, the higher the glass transition temperature becomes, while the greater the proportion of the repeating units represented by the formulas (2a) and (2b) (referred to as [(2a)+(2b)]hereinafter) is, the lower the glass transition temperature becomes. Accordingly, it is possible to control a temperature capable of adhering the adhesive by controlling glass transition temperature of the polyimide.

Accordingly, a preferred polyimide used in the present invention comprises from 100 to 40 mol % of at least one of the repeating units represented by the above formulas (1a) and (1b) and from 0 to 60 mol % of at least one of the repeating units represented by the above formulas (2a) and (2b), which has a number average molecular weight of from 4,000 to 400,000.

The above polyimides to be used in the present invention can be produced according to conventional processes for producing polyimides. In concrete, they can be produced from tetracarboxylic dianhydrides corresponding to the desired repeating units with diamines or diisocyanates corresponding to the desired repeating unit.

Typically, the above polyimide can be produced by reacting tetracarboxylic dianhydrides represented by the following formula (3a) and/or (3b) with a compound represented by the following formula (4) and/or a siloxane compound represented by the following formula (5).

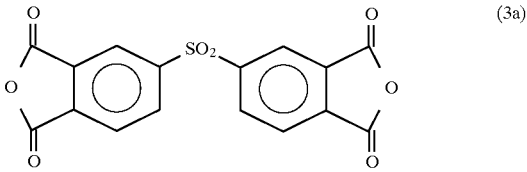

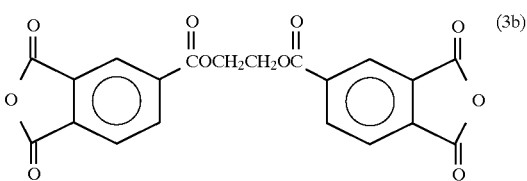

wherein Ar is the same meaning as described above and Y is an amino group or an isocyanate group.

wherein R is an alkylene group having 1 to 10 carbon atoms or $-CH_2OC_6H_4-$, the methylene group of which attaches to Si, and n means an integer of 1 to 20.

Examples of tetracarboxylic dianhydrides represented by the formulas (3a) and (3b) which are used as raw materials for producing the polyimide and form the basic construction of them are 3,3',4,4'-diphenylsulfonetetracarboxylic dianhydride and ethylene glycol bistrimellitate dianhydride, respectively.

Examples of the compound represented by the formula (4) include those wherein Ar is a divalent group selected from the above mentioned formulas having aromatic rings. Typical examples of the compound wherein the functional group Y is an amino group include the following diamines: 3,3'-diaminobiphenyl, 3,4'-diaminobiphenyl, 4,4'-diaminobiphenyl, 3,3'-diaminodiphenylmethane, 3,4'-diaminodiphenylmethane, 4,4'-diaminodiphenylmethane, 2,2-(3,3'-diaminodiphenyl)propane, 2,2-(3,4'-diaminodiphenyl)propane, 2,2-(4,4'-diaminodiphenyl)propane, 2,2-(3,3'-diaminodiphenyl)hexafluoropropane, 2,2-(3,4'-diaminodiphenyl)hexafluoropropane, 2,2-(4,4'diaminodiphenyl)hexafluoropropane, 3,3'-oxydianiline, 3,4'-oxydianiline, 4,4'-oxydianiline, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 3,3'-bis(3-aminophenoxy)diphenyl ether, 3,3'-bis(4-aminophenoxy)diphenyl ether, 3,4'-bis(3- aminophenoxy)diphenyl ether, 3,4'-bis(4-aminophenoxy) diphenyl ether, 4,4'-bis(3-aminophenoxy)diphenyl ether, 4,4-bis(4-aminophenoxy)diphenyl ether, 3,3'-bis(3-aminophenoxy)diphenyl, 3,3'-bis(4-aminophenoxy)biphenyl, 3,4-bis (3-aminophenoxy)biphenyl, 3,4'-bis (4aminophenoxy)biphenyl, 4,4'-bis(3-aminophenoxy)biphenyl, 4,4'-bis(4-aminophenoxy)biphenyl, bis[4-(3-aminophenoxyphenyl]sulfone, bis[4-(4-aminophenoxy) phenyl]sulfone, 2,2-bis[3-(3-aminophenoxy)phenyl] propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4-aminophenoxy)phenyl]hexafluoropropane, 2,2-bis[4-(3-aminophenoxy)phenyl]hexafluoropropane, 2,2-bis[4-(4-aminophenoxy)phenyl]hexafluoropropane, 9,9-bis(3-aminophenyl)fluorene, 9,9-bis(4-aminophenyl)fluorene, 3,3'-diamino-2,2',4,4'-tetramethyldiphenylmethane, 3,3'-diamino-2,2',4,4'-tetraethyldiphenylmethane, 3,3'-diamino-2,2',4,4'-tetrapropyldiphenylmethane, 3,3'-diamino-2,2',4,4'-tetraisopropyldiphenylmethane, 3,3'-diamino-2,2',4,4'-tetrabutyldiphenylmethane, 3,4'-diamino-2,3',4,5'-tetramethyldiphenylmethane, 3,4'-diamino-2,3',4,5'-tetraethyldiphenylmethane, 3,4'-diamino-2,3',4,5'-tetrapropyldiphenylmethane, 3,4'-diamino-2,3',4,5'-tetraisopropyldiphenylmethane, 3,4'-diamino-2,3',4,5'-tetrabutyldiphenylmethane, 4,4'-diamino-3,3',5,5'-tetramethyldiphenylmethane, 4,4'-diamino-3,3',5,5'-tetraethyldiphenylmethane, 4,4'-diamino-3,3',5,5'-tetrapropyldiphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-diethyl-5,5'-dimethyldiphenylmethane, 4,4'-diamino-3,3'-dimethyldiphenylmethane, 4,4'-diamino-3,3'-diethyldiphenylmethane, 4,4'-diamino-3,3',5,5'-tetramethoxydiphenylmethane, 4,4'-diamino-3,3',5,5'-tetraethoxydiphenylmethane, 4,4'-diamino-3,3',5,5'-tetrapropoxydiphenylmethane, 4,4'-diamino-3,3',5,5'-tetraisopropoxydiphenylmethane, 4,4'-diamino-3,3',5,5'-tetrabutoxydiphenylmethane, 4,4'-diamino-3,3'-dimethoxydiphenylmethane, 4,4'-diamino-3,3'-diethoxydiphenylmethane and the like. Examples of diisocyanates which are the compounds represented by the formula (4) wherein the functional group Y is an isocyanate group include those exemplified in the above mentioned diamines in which "amino" is replaced by "isocyanate".

Examples of the diamines in the compounds represented by the formula (5) wherein the functional group Y is an amino group include bis(3-aminopropyl) tetramethyldisiloxane, bis(10-aminodecamethylene) tetramethyldisiloxane, tetramer and octamer of dimethylsiloxane having aminopropyl at the terminal, bis(3-aminophenoxymethyl)tetramethyldisiloxane, etc. They can be used as a mixture. Examples of the diisocyanates in the compounds represented by the formula (5) wherein the functional group Y is an isocyanate include those exemplified in the above diamines wherein "amino" is replaced by "isocyanate".

The diisocyanates wherein the functional group Y in the above mentioned formulas (4) and (5) is an isocyanate group can be easily produced by reacting the above exemplified corresponding diamine with phosgene.

The polyimides of the present invention can be produced as follows.

Examples of processes for producing the polyimide using tetracarboxylic dianhyrides and diamines as the raw materials for the polyimide include the following. A process for directly obtaining a polyimide by heating a tetracarboxylic dianhyrides and diamines in an organic solvent, optionally in the presence of a catalyst (in an amount of not more than 20 parts by weight of the reactants) such as tributylamine, triethylamine, or triphenyl phosphate to a temperature of not less than 100° C., and preferably not less than 180° C. A process for obtaining a polyimide by reacting tetracarboxylic dianhyrides with diamines in an organic solvent at a temperature of not more than 100° C. to obtain a polyamic acid which is a precursor of the polyimide, optionally adding a dehydrating such as p-toluenesulfonic acid (in an amount of 1 to 5 times the mol of the tetracarboxylic dianhydride), and then heating the solution to cause an imidation. A process in which the above-mentioned polyamic acid is caused to a ring closing reaction at a relatively low temperature (in a range from room temperature to 100° C.) by adding dehydrating ring closing agent such as an anhydride, e.g., acetic anhydride, propionic anhydride or benzoic anhydride, a carbodiimide compound, e.g., dicyclohexylcarbodiimide, and optionally a ring closing catalyst such as pyridine, isoquinoline, imidazole and triethylamine (as for the dehydrating ring closing agent and ring closing catalyst, in an amount of 2 to 10 times the mol of the tetracarboxylic dianhydride).

Examples of the organic solvents used in these reactions include aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, and phenol solvents such as phenol, cresol, xylenol, and p-chlorophenol. Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichloroethylene, and nitrobenzene can be mixed with the above-mentioned solvents as a mixture.

In the case where tetracarboxylic dianhydrides and diisocyanates are used as the raw materials, the product can be produced according to the above-mentioned process for directly obtaining a polyimide. In this case, the reaction temperature is preferably not less than room temperature, and particularly not less than 60° C. The polyimide having a high polymerization degree can be produced by the reaction between equimolar amounts of the tetracarboxylic dianhydrides with the diamines or diisocyanates. If necessary, either of them is capable of using in an excess amount of less than 10% by mol.

Since the film formability depends upon molecular weight of the polyimide used in the present invention, the molecular weight can be optimally decided according to desired film formability. When being used in the present invention, polyimide having too low molecular weight is not preferred because film formability in some degree is required in the adhesive layer even in the case of the liquid form and the heat resistance is also lowered. In the present invention, the molecular weight is required to be not less than 4,000. When being used as a thermoplasitic adhesive, the adhesion is changed for the worse, if the viscosity during the melting is too high. The molecular weight is a factor for controlling the viscosity during the melting. In the case of the polyimide used in the present invention, number molecular weight is approximately not more than 400,000. If the molecular weight is higher than this value, there is a high increase in the viscosity making it difficult to be used as an adhesive.

In present invention, though the above mentioned polyimides are used alone in two adhesive layers, two or more kinds selected from the above described polyimides may be suitably mixed in order to control the glass transition temperature (Tg).

The adhesive tape for electronic parts of the present invention which is composed of, as described above, two adhesive layers containing the polyimides having each a different Tg, can be produced by known coating methods or by methods of laminating two polyimide films. For example, it is possible to utilize a coating method which comprises applying one coating solution containing the polyimide to a surface of a releasing film, drying to form an adhesive layer, and then applying the other coating solution containing the polyimide having a different Tg on the formed adhesive layer, followed by drying, or applying two kinds of the coating solutions simultaneously and drying, a method which comprises laminating two polyimide containing films having each a different Tg under pressure with heat, and a method which comprises previously forming a polyimide film and applying a coating solution containing the polyimide having a different Tg to the polyimide film and drying. In the adhesive tape for electronic parts of the present invention, the whole thickness which can be suitably varied is generally in a range of 10–150 μm, and each layer has a thickness of 5 μm or more so as to have tolerable adhesive strength.

In order to form the adhesive layer by application, a polyimide coating varnish obtained by dissolving the above described polyimide in a suitable solvent is used. Examples of the organic solvents used for dissolving the polyimide include various organic solvents such as aprotic polar solvents, e.g., N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alcoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloromethane, and the like can be mixed and used in such a degree that the polyimide is not separated.

It is preferred to suitably control concentration and viscosity of the polyimide coating varnish according to the applications.

In the two adhesive layers of the present, a filler having a particle size of not more tan 1 μm may be incorporated for the purpose of controlling characteristics during the adhering. The content of the filler when being incorporated is preferably from 0.1 to 50% by weight, and more preferably from 4 to 25% by weight, based on the total solid content. If the content of the filler exceeds 50% by weight, the adhesion strength is remarkably lowered. Conversely, if it is less than 0.1% by weight, no effect of the addition of the filler can be obtained.

Examples of the fillers which can be used are silica, quarts powder, mica, alumina, diamond powder, zircon powder, calcium carbonate, magnesium oxide, fluorine containing resin, and the like.

The release film used in the present invention serves as a temporary base, which has a thickness of from 1 to 200 μm. Typical examples of the release film used include resin films made of polyethylene, polypropylene, fluorine containing resin, polyethylene terephthalate, polyimide, etc. and paper, and those the surface of which is subjected to releasing treatment with, for example, a silicone releasing agent.

In the adhesive tape of the present invention, it is possible to provide on the formed adhesive layer the above-mentioned release film as a protective layer.

As be clear from the results of examination shown hereafter, the adhesive tape for electronic parts of the present invention has remarkably high reliability for adhering electronic parts, because of having sufficient heat resistance and adhesive strength. The adhesive tape of the present invention can be suitably used for adhering between parts around leadframes making up a semiconductor device, for example, lead pins, semiconductor-mounted substrate, heat spreader, and semiconductor chips themselves, and the adhesive tape for electronic parts of the present invention can suitably be used as an adhesive tape for the innerlead fix of the leadframe and a TAB tape, etc.

EXAMPLE

The present invention will now be described in greater detail. First, examples for producing polyimides and coating varnishes containing polyimide used in the present invention shown.

Synthetic Example 1

Into a flask equipped with a stirrer were introduced 12.34 g (67 mmol) of 3,4'-diaminobiphenyl, 8.20 g (33 mmol) of 1,3-bis(3-aminopropyl)-1,1,3,3-tetramethyldisiloxane, 35.83 g (100 mmol) of 3,3',4,4'diphenylsulfonetetracarboxylic dianhydride, and 300 ml of N-methyl-2-pyrrolidone at an iced temperature, and stirring was continued for 1 hour. Consequently, the solution was reacted at room temperature for 3 hours to synthesize a polyamic acid. To the resulting polyamic acid were added 50 ml of toluene and 1.0 g of p-toluenesulfonic acid, the mixture was heated to 160° C., and an imidation reaction was carried out for 3 hours while separating water which was flowed by being azeotropically distilled with toluene. After toluene was distilled off, the resulting polyimide varnish was poured in methanol, followed by separation of the resulting precipitate, pulverization, washing, and drying to obtain 50.0 g (yield: 95%) of a polyimide composed of the above mentioned repeating units in a proportion of [(1a)+(1b)]:[(2a)+(2b)]=67:33 wherein (1a):(1b)=100:0 and (2a):(2b)=100:0.

The IR spectrum measurement of the resultant polyimide showed typical absorption bands of imide at 1718 $cm^{-1}$ and 1783 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 2

Using 13.41 g (67 mmol) of 4,4'-oxydianiline, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 51.0 g (yield: 95%) by the same manner as in Synthetic Example 1.

The IR spectrum measurement of the resultant polyimide showed typical absorption bands of imide at 1718 $cm^{-1}$ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 3

Using 13.29 g (67 mmol) of 4,4'-diaminodiphenylmethane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 52.0 g (yield: 97%) by the same manner as in Synthetic Example 1.

The IR spectrum measurement of the resultant polyimide showed typical absorption bands of imide at 1718 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 4

Using 14.49 g (67 mmol) of 4,4'-diaminodiphenyl sulfide, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)] 67:33 wherein (1a):(1b)=100:0 and (2a):(2b)=100:0 was obtained in an amount of 51.0 g (yield: 93%) by the same manner as in Synthetic Example 1.

The IR spectrum measurement of the resultant polyimide showed typical absorption bands of imide at 1718 cm⁻¹ and 1780 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 5

Using 16.64 g (67 mmol) of 3,3'-diaminodiphenyl sulfone, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 51.5 g (yield: 90%) by the same manner as in Synthetic Example 1.

The IR spectrum measurement of the resultant polyimide showed typical absorption bands of imide at 1715 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 6

Using 15.16 g (67 mmol) of 2,2-bis(4-aminophenyl) propane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 54.0 g (yield: 97%) by the same manner as in Synthetic Example 1.

The IR spectrum measurement of the resultant polyimide showed typical absorption bands of imide at 1718 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 7

Using 22.40 g (67 mmol) of 2,2-bis(4-aminophenyl) hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 60.0 g (yield: 95%) by the same manner as in Synthetic Example 1.

The IR spectrum measurement of the resultant polyimide showed typical absorption bands of imide at 1721 cm⁻¹ and 1783 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by. weight to produce a coating varnish.

Synthetic Example 8

Using 19.58 g (67 mmol) of 1,4-bis(4-aminophenoxy) benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b))]:[(2a)+(2b)] 67:33 wherein (1a):(1b)=100:0 and (2a):(2b)=100:0 was obtained in an amount of 58.0 g (yield: 97%) by the same manner as in Synthetic Example 1.

The IR spectrum measurement of the resultant polyimide showed typical absorption bands of imide at 1718 cm⁻¹ and 1780 cm⁻¹. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 9

Using 19.58 g (67 mmol) of 1,3-bis(4-aminophenoxy) benzene, 8.20 g (33 mmol) of 1,3-bis(3-aminopropyl)-1,1,3,3-tetramethyldisiloxane, 35.83 g (100 mmol) of 3,3',4,4'- diphenylsulfonetetracarboxylic dianhydride, and 300 ml of N-methyl-2-pyrrolidone, a polyimide composed of the repeating units in a proportion of [(1a)+(1b)]:[(2a)+(2b)]= 67:33 wherein (1a):(1b)=100:0 and (2a):(2b)=100:0 was obtained in an amount of 58.0 g (yield: 97%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 10

Using 23.08 g (67 mmol) of 1,3-bis[1-(4-aminophenyl)-1-methylethyl]benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 62.5 g (yield: 98%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 11

Using 24.68 g (67 mmol) of bis(4-aminophenoxy)biphenyl, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]= 67:33 wherein (1a):(1b)=100:0 and (2a):(2b)=100:0 was obtained in an amount of 64.0 g (yield: 98%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 12

Using 25.75 g (67 mmol) of 4,4'-bis(4-aminophenoxy)diphenyl ether, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 64.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 13

Using 28.98 g (67 mmol) of bis[4-(4-aminophenoxy)phenyl]sulfone, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 65.0 g (yield: 94%) by the same manner as in Synthetic Example 1.

The IR spectrum measurement of the resultant polyimide showed typical absorption bands of imide at 1719 cm$^{-1}$ and 1785 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 14

Using 27.50 g (67 mmol) of 2,2-bis[4-(4-aminophenoxy)phenyl]propane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 65.0 g (yield: 96%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polymide dissolved in tetrahydrofuran so as to be the concentration of 25% by weight to produce a coating varnish. Synthetic Example 15

Using 34.74 g (67 mmol) of 2,2-bis[4-(4-aminophenoxy)phenyl]hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 74.0 g (yield: 98%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 16

Using 23.35 g (67 mmol) of 9,9-bis(4-aminophenoxy)fluorene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 60.5 g (yield: 95%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 17

Using 13.82 g (75 mmol) of 3,4'-diaminobiphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 54.0 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 18

Using 15.02 g (75 mmol) of 4,4'-oxydianiline, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 52.0 g (yield: 89%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 19

Using 14.87 g (75 mmol) of 4,4'-diaminodiphenylmethane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]: [(2a)+(2b)]=75:25 wherein (1a):(1b)=0:100 and (2a):(2b)=0:100 was obtained in an amount of 55.0 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 20

Using 16.22 g (75 mmol) of 4,4'-diaminodiphenyl sulfide, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 54.0 g (yield: 90%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 21

Using 18.63 g (75 mmol) of 3,3'-diaminodiphenyl sulfone, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 55.5 g (yield: 89%) by the same manner as in Synthetic Example 1.

The IR spectrum measurement of the resultant polyimide showed typical absorption bands of imide at 1715 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 22

Using 16.97 g (75 mmol) of 2,2-bis(4-aminophenyl)propane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 57.0 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 23

Using 25.07 g (75 mmol) of 2,2-bis(4-aminophenyl) hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 67.0 g (yield: 98%) by the same manner as in Synthetic Example 1.

The IR spectrum measurement of the resultant polyimide showed typical absorption bands of imide at 1721 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 24

Using 21.92 g (75 mmol) of 1,4-bis(4-aminophenoxy) benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 62.0 g (yield: 95%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 25

Using 21.92 g (75 mmol) of 1,3-bis(4-aminophenoxy) benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 64.0 g (yield: 97%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 26

Using 25.84 g (75 mmol) of 1,3-bis[1-(4-aminophenyl)-1-methylethyl]benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 67.0 g (yield: 96%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 27

Using 27.63 g (75 mmol) of bis(4-aminophenoxy) biphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 69.5 g (yield: 98%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 28

Using 28.82 g (75 mmol) of 4,4'-bis(4-aminophenoxy) diphenyl ether, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0.100 and (2a):(2b)=0:100 was obtained in an amount of 70.0 g (yield: 97%) by the same manner as in Synthetic Example 1.

IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 29

Using 32.08 g (75 mmol) of bis[4-(4-aminophenoxy) phenyl]sulfone, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]= 75:25 wherein (1a):(1b)=0:100 and (2a):(2b)=0:100 was obtained in an amount of 74.0 g (yield: 97%) by the same manner as in Synthetic Example 1.

The IR spectrum measurement of the resultant polyimide showed typical absorption bands of imide at 1719 $cm^{-1}$ and 1785 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 30

Using 30.78 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 73.0 g (yield: 98%) by the same manner as in Synthetic Example 1.

The IR spectrum measurement of the resultant polyimide showed typical absorption bands of imide at 1720 $cm^{-1}$ and 1783 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 31

Using 38.89 g (75 mmol) of 2,2-bis[4-(4-aminophenoxy) phenyl]hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 80.0 g (yield: 97%) by the same manner as in Synthetic Example 1.

The IR spectrum measurement of the resultant polyimide showed typical absorption bands of imide at 1715 $cm^{-1}$ and 1786 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 32

Using 26.14 g (75 mmol) of 9,9-bis(4-aminophenoxy) fluorene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 66.0 g (yield: 95%) by the same manner as in Synthetic Example 1.

The IR spectrum measurement of the resultant polyimide showed typical absorption bands of imide at 1720 $cm^{-1}$ and 1780 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 33

Using 20.53 g (50 mmol) of 2,2-bis[4-(4-aminophenoxy) phenyl]propane, 12.43 g (50 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=50:50 wherein (1a):(1b)=100:0 and (2a):(2b)=100:0 was obtained in an amount of 61.0 g (yield: 93%) by the same manner as in Synthetic Example 1.

The IR spectrum measurement of the resultant polyimide showed typical absorption bands of imide at 1715 $cm^{-1}$ and 1786 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 34

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b) ]:[(2a)+(2b)]=75:25 wherein (1a):(1b)=100:0 and (2a):(2b)=100:0 was obtained in an amount of 65.0 g (yield: 94%) by the same manner as in Synthetic Example 1.

The IR spectrum measurement of the resultant polyimide showed typical absorption bands of imide at 1720 $cm^{-1}$ and 1783 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 35

Using 32.84 g (80 mmol) of 2,2-bis[4-(4-aminophenoxy) phenyl]propane, 4.97 g (20 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=80:20 wherein (1a):(1b)=100:0 and (2a):(2b)=100:0 was obtained in an amount of 68.0 g (yield: 97%) by the same manner as in Synthetic Example 1.

The IR spectrum measurement of the resultant polyimide showed typical absorption bands of imide at 1720 $cm^{-1}$ and 1783 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 36

Using 36.95 g (90 mmol) of 2,2-bis[4-(4-aminophenoxy) phenyl]propane, 2.49 g (10 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=90:10 wherein (1a):(1b)=100:0 and (2a):(2b)=100:0 was obtained in an amount of 69.0 g (yield: 97%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 37

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 17.91 g (50 mmol) of 3,3',4,4'-diphenylsulfonetetracarboxylic dianhydride, 20.53 g (50 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=50:50 and (2a):(2b)=50:50 was obtained in an amount of 68.5 g (yield: 95%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 38

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 8.96 g (25 mmol) of 3,3',4,4'-diphenylsulfonetetracarboxylic dianhydride, 30.77 g (75 mmol) of ethylene glycol bistrimellitate dianhydride and 300 ml of N-methyl-2-pyrrolidone, a polyimide composed of the repeating units in a proportion of [(1a)+(1b) )]:[(2a)+(2b)]=75:25 wherein (1a):(1b)=25:75 and (2a):(2b)=25:75 was obtained in an amount of 69.5 g (yield: 95%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 39

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 26.87 g (75 mmol) of 3,3',4,4'-diphenylsulfonetetracarboxylic dianhydride, 10.26 g (25 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=75:25 and (2a):(2b)=75:25 was obtained in an amount of 66.0 g (yield: 94%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 40

Using 30.79 g (75 mmol) of 2,2-bis[4-(4-aminophenoxy) phenyl]propane, 9.42 g (25 mmol) of 1,3-bis[(aminophenoxy)methyl]-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 69.0 g (yield: 95%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 41

Using 30.79 g (75 mmol) of 2,2-bis[4-(4-aminophenoxy) phenyl]propane, 10.72 g (25 mmol) of aminopropyl terminated dimethylsiloxane tetramer represented by the following formula (5) wherein Y=NH$_2$, R=propylene, n=3:

35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 67.0 g (yield: 91%) by the same manner as in Synthetic Example 1.

The IR spectrum measurement of the resultant polyimide showed typical absorption bands of imide at 1712 cm$^{-1}$ and 1783 cm$^{-1}$. The molecular weight, glass transition temperature and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 42

Using 31.04 g (100 mmol) of 4,4'-diamino-3,3',5,5'tetraethyldiphenylmethane, 35.83 g (100 mmol) of 3,3',4,4'diphenylsulfone tetracarboxylic dianhydride and 300 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 58.8 g (yield: 93%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 43

Using 15.52 g (50 mmol) of 4,4'-diamino-3,3',5,5'-tetraethyldiphenylmethane, 13.34 g (37.5 mmol) of 3,3',4,4'diphenylsulfone tetracarboxylic dianhydride, 5.13 g (12.5 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=75:25 and (2a):(2b)=0:0 was obtained in an amount of 29.6 g (yield: 92%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 44

Using 15.52 g (50 mmol) of 4,4'-diamino-3,3',5,5'-tetraethyldiphenylmethane, 8.89 g (25 mmol) of 3,3',4,4'-diphenylsulfone tetracarboxylic dianhydride, 10.26 g (25 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=50:50 and (2a):(2b)=0:0 was obtained in an amount of 29.6 g (yield: 92%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 45

Using 7.76 g (25 mmol) of 4,4'-diamino-3,3',5,5'-tetraethyldiphenylmethane, 6.21 g (25 mmol) of bis(3-aminopropyl)tetramethyldisiloxane, 17.91 g (50 mmol), 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=50:50 wherein (1a):(1b)=100:0 and (2a):(2b)=100:0 was obtained in an amount of 27.4 g (yield: 91%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 46

Using 11.64 g (37.5 mmol) of 4,4'-diamino-3,3',5,5'-tetraethyldiphenylmethane, 3.11 g (12.5 mmol) of bis(3-aminopropyl)tetramethyldisiloxane, 17.91 g (50 mmol), 3,3',4,4'-diphenylsulfone tetracarboxylic dianhydride and 150 ml of N-methyl-2-pyrrolidone, a polyimide composed of the repeating units in a proportion of [(1a)+(1b)]: [(2a)+(2b)]=75:25 wherein (1a):(1b)=100:0 and (2a):(2b)=100:0 was obtained in an amount of 29.6 g (yield: 92%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce s coating varnish.

Synthetic Example 47

Using 12.72 g (50 mmol) of 4,4'-diamino-3,3',5,5'-tetraethyldiphenylmethane, 20.51 g (50 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=0:100 and (2a):(2b)=0:0 was obtained in an amount of 29.5 g (yield: 94%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 48

Using 15.52 g (50 mmol) of 4,4'-diamino-3,3',5,5'-tetramethyldiphenylmethane, 20.51 g (50 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=0:100 and (2a):(2b)=0:0 was obtained in an amount of 31.8 g (yield: 93%) by the same manner as in Synthetic Example 1.

The IR spectrum measurement of the resultant polyimide showed typical adsorption bands of imide at 1720 cm$^{-1}$ and 1780 cm$^{-1}$. The molecular weight, glass transition temperature, and temperature of initiating thermal decomposition of the polyimide were determined. The results are shown in Table 1.

The resultant polyimide was dissolved in tetrahydrofuran so as to be the concentration of 25% by weight to produce a coating varnish.

TABLE 1

| Synthetic Ex. No. | Number average molecular weight | Glass transition temperature (°C.) | Temperature of initiating thermal decomposition (°C.) |
|---|---|---|---|
| 1 | 39,000 | 230 | 452 |
| 2 | 14,000 | 217 | 456 |
| 3 | 37,000 | 180 | 450 |
| 4 | 13,000 | 220 | 451 |
| 5 | 48,000 | 190 | 450 |
| 6 | 68,000 | 190 | 450 |
| 7 | 40,000 | 190 | 455 |
| 8 | 39,000 | 230 | 450 |
| 9 | 25,000 | 192 | 450 |
| 10 | 38,000 | 160 | 450 |
| 11 | 53,000 | 232 | 450 |
| 12 | 25,000 | 230 | 453 |
| 13 | 12,000 | 170 | 450 |
| 14 | 26,000 | 211 | 458 |
| 15 | 23,000 | 201 | 451 |
| 16 | 36,000 | 241 | 452 |
| 17 | 29,000 | 190 | 452 |
| 18 | 12,000 | 177 | 456 |
| 19 | 27,000 | 140 | 455 |
| 20 | 13,000 | 180 | 451 |
| 21 | 38,000 | 150 | 453 |
| 22 | 58,000 | 153 | 453 |
| 23 | 38,000 | 149 | 455 |
| 24 | 29,000 | 190 | 453 |
| 25 | 15,000 | 152 | 454 |
| 26 | 28,000 | 130 | 453 |
| 27 | 43,000 | 182 | 452 |
| 28 | 22,000 | 190 | 453 |
| 29 | 11,000 | 134 | 451 |
| 30 | 22,000 | 171 | 448 |
| 31 | 21,000 | 161 | 454 |
| 32 | 26,000 | 201 | 455 |
| 33 | 23,000 | 180 | 451 |
| 34 | 45,000 | 226 | 465 |
| 35 | 46,000 | 236 | 464 |
| 36 | 48,000 | 248 | 460 |
| 37 | 34,000 | 199 | 458 |
| 38 | 31,000 | 183 | 455 |
| 39 | 43,000 | 220 | 465 |
| 40 | 44,000 | 230 | 455 |
| 41 | 43,000 | 180 | 440 |
| 42 | 49,000 | 282 | 446 |
| 43 | 81,000 | 252 | 420 |
| 44 | 89,000 | 226 | 410 |
| 45 | 26,000 | 186 | 458 |
| 46 | 69,000 | 224 | 421 |
| 47 | 37,000 | 232 | 400 |
| 48 | 31,000 | 200 | 421 |

In the above Table 1, the measurement of the molecular weight of polyimides was carried out using tetrahydrofuran as an eluent and Shodex 80M×2 as a column. Value of the molecular weight is a number average molecular weight which is calculated as polystyrene. The glass transition temperature was determined by a differential thermal analysis (in a nitrogen atmosphere, heated at 10° C./min.) and the temperature of initiating thermal decomposition was determined by a thermogravimetry (in a nitrogen atmosphere, heated at 10° C./min.)

Example 1

The coating varnish containing the polyimide obtained in Synthetic Example 42 was applied to a surface of a releasing film composed of polyethylene terephthalate having the thickness of 50 μm (300×500 cm) by a barcoater so as to a dried thickness of 20 μm, and dried in a hot air circulating oven at 150° C. for 5 minutes to form the first adhesive layer. Then, the coating varnish containing the polyimide obtained in Synthetic Example 2 (Tg of which was different from that of the polyimide used for the first adhesive layer) was applied to a surface of the first adhesive layer so as to a dried thickness of 20 μm, and dried in a hot air circulating oven at 150° C. for 10 minutes to form the second adhesive layer on the first adhesive layer, by which an adhesive tape having a thickness of 40 μm was produced.

Examples 2–40

Adhesive tapes were produced by the same manner as in Example 1, except that each coating varnish containing the polyimide in the above described Synthetic Examples was used alone or as a mixture of two or more thereof, or a coating varnish containing the filler was used, by which two adhesive layers having each different Tg were formed.

Comparative Example 1

Using the coating varnish obtained in Synthetic Example 10, an adhesive tape having the thickness 40 μm which consists of two adhesive layers having each the same Tg was produced by the same manner as in Example 1.

Comparative Example 2

The coating varnish obtained in Synthetic Example 10 was applied to both sides of a polyimide film having the thickness 25 μm so as to form adhesive layers having each the dried thickness of 20 μm, and dried in a hot air circulating oven at 150° C. for 15 minutes to form an adhesive tape.

Comparative Example 3

A 20% by weight solution of polyimide varnish (Lark TPI, produced by MITSUI TOATSU CHEMICALS INC.) in N-methyl-2-pyrrolidone was prepared. This solution was applied to a surface of a releasing polyethylene terephthalate, followed by drying in a hot air circulating oven at 150° C. for 120 minutes. Thereafter, the same solution was applied to the formed adhesive layer and dried in the hot air circulating oven at 150° C. for 120 minutes. In this case, applications were controlled so as to form two adhesive layers having each a dried thickness of 20 μm. After the releasing film was peeled off, the adhesive layers were dried at 250° C. for 60 minutes to produce an adhesive tape.

Comparative Example 4

A 20% by weight solution of polyimide varnish (Lark TPI, produced by MITSUI TOATSU CHEMICALS INC.) in N-methyl-2-pyrrolidone was prepared. This solution was applied to both sides of a releasing polyethylene terephthalate by the same manner as in Comparative Example 2 so as to form adhesive layers having each a dried thickness of 20

μm, followed by drying in a hot air circulating oven at 150° C. for 120 minutes and then at 250° C. for 60 minutes to obtain an adhesive tape.

Coating varnishes for the adhesive layers, fillers and amounts thereof, and adhesion temperatures of the formed adhesive layers are shown in Table 2.

TABLE 2

| Adhesive tape | Higher Tg adhesive layer | | Adhesion temperature of higher Tg layer (°C.) | Lower Tg adhesive layer | | Adhesion temperature of lower Tg layer (°C.) |
| | Coating varnish | Filler (wt. %) | | Coating varnish | Filler (wt. %) | |
|---|---|---|---|---|---|---|
| Ex. 1 | Syn. Ex. 42 | 0 | 370 | Syn. Ex. 2 | 0 | 300 |
| Ex. 2 | Syn. Ex. 1 | 0 | 310 | Syn. Ex. 3 | 0 | 260 |
| Ex. 3 | Syn. Ex. 11 | 0 | 320 | Syn. Ex. 5 | 0 | 270 |
| Ex. 4 | Syn. Ex. 8 | 0 | 310 | Syn. Ex. 6 | 0 | 270 |
| Ex. 5 | Syn. Ex. 11 | 0 | 320 | Syn. Ex. 7 | 0 | 270 |
| Ex. 6 | Syn. Ex. 43 | 0 | 340 | Syn. Ex. 9 | 0 | 280 |
| Ex. 7 | Syn. Ex. 4 | 0 | 300 | Syn. Ex. 10 | 0 | 240 |
| Ex. 8 | Syn. Ex. 12 | 0 | 310 | Syn. Ex. 13 | 0 | 250 |
| Ex. 9 | Syn. Ex. 16 | 0 | 350 | Syn. Ex. 14 | 0 | 300 |
| Ex. 10 | Syn. Ex. 43 | 0 | 340 | Syn. Ex. 15 | 0 | 290 |
| Ex. 11 | Syn. Ex. 43 | 0 | 340 | Syn. Ex. 17 | 0 | 270 |
| Ex. 12 | Syn. Ex. 34 | 0 | 320 | Syn. Ex. 18 | 0 | 260 |
| Ex. 13 | Syn. Ex. 35 | 0 | 320 | Syn. Ex. 19 | 0 | 220 |
| Ex. 14 | Syn. Ex. 36 | 0 | 330 | Syn. Ex. 20 | 0 | 260 |
| Ex. 15 | Syn. Ex. 39 | 0 | 300 | Syn. Ex. 21 | 0 | 230 |
| Ex. 16 | Syn. Ex. 40 | 0 | 310 | Syn. Ex. 22 | 0 | 240 |
| Ex. 17 | Syn. Ex. 42 | 0 | 370 | Syn. Ex. 23 | 0 | 230 |
| Ex. 18 | Syn. Ex. 43 | 0 | 340 | Syn. Ex. 24 | 0 | 270 |
| Ex. 19 | Syn. Ex. 44 | 0 | 310 | Syn. Ex. 25 | 0 | 240 |
| Ex. 20 | Syn. Ex. 46 | 0 | 330 | Syn. Ex. 26 | 0 | 210 |
| Ex. 21 | Syn. Ex. 47 | 0 | 320 | Syn. Ex. 27 | 0 | 240 |
| Ex. 22 | Syn. Ex. 34 | 0 | 320 | Syn. Ex. 28 | 0 | 260 |
| Ex. 23 | Syn. Ex. 34 | 0 | 320 | Syn. Ex. 29 | 0 | 250 |
| Ex. 24 | Syn. Ex. 43 | 0 | 340 | Syn. Ex. 30 | 0 | 290 |
| Ex. 25 | Syn. Ex. 46 | 0 | 330 | Syn. Ex. 31 | 0 | 260 |
| Ex. 26 | Syn. Ex. 43 | 0 | 340 | Syn. Ex. 32 | 0 | 290 |
| Ex. 27 | Syn. Ex. 46 | 0 | 330 | Syn. Ex. 33 | 0 | 260 |
| Ex. 28 | Syn. Ex. 43 | 0 | 340 | Syn. Ex. 37 | 0 | 280 |
| Ex. 29 | Syn. Ex. 46 | 0 | 330 | Syn. Ex. 38 | 0 | 270 |
| Ex. 30 | Syn. Ex. 46 | 0 | 330 | Syn. Ex. 41 | 0 | 260 |
| Ex. 31 | Syn. Ex. 46 | 0 | 330 | Syn. Ex. 45 | 0 | 290 |
| Ex. 32 | Syn. Ex. 43 | 0 | 340 | Syn. Ex. 48 | 0 | 280 |
| Ex. 33 | Syn. Ex. 35 | 0 | 320 | Syn. Ex. 1/Syn. Ex. 10 = 60/40 | 0 | 280 |
| Ex. 34 | Syn. Ex. 35 | 0 | 320 | Syn. Ex. 16/Syn. Ex. 10 = 50/50 | 0 | 280 |
| Ex. 35 | Syn. Ex. 35 | 0 | 320 | Syn. Ex.33/Syn. Ex. 36 = 50/50 | 0 | 280 |
| Ex. 36 | Syn. Ex. 35 | 0 | 320 | Syn. Ex. 8/Syn. Ex. 26 = 20/80 | 0 | 230 |
| Ex. 37 | Syn. Ex. 35 | 0 | 320 | Syn. Ex. 10 | Alumina 10 | 270 |
| Ex. 38 | Syn. Ex. 14 | Alumina 10 | 330 | Syn. Ex. 45 | 0 | 290 |
| Ex. 39 | Syn. Ex. 35 | 0 | 320 | Syn. Ex. 10 | Silica 10 | 270 |
| Ex. 40 | Syn. Ex. 14 | Silica 10 | 330 | Syn. Ex. 45 | 0 | 290 |
| Com. Ex. 1 | Syn. Ex. 10 | 0 | 240 | Syn. Ex. 10 | 0 | 240 |
| Com. Ex. 2 | Syn. Ex. 10 | 0 | 240 | Syn. Ex. 10 | 0 | 240 |
| Com. Ex. 3 | Lark TPI | 0 | 380 | Lark TPI | 0 | 380 |
| Com. Ex. 4 | Lark TPI | 0 | 380 | Lark TPI | 0 | 380 |

Note)
"Silica": Silica filler; produced by Arakawa Chemical Industries Co., Ltd. particle size: 0.07 μm.
"Alumina": Alumina filler; produced by Showa Denko K.K.; particle size: 0.05 μm.

In order to evaluate the adhesive tapes obtained in the Examples and Comparative Examples, the following operations were carried out. The releasing polyethylene terephthalate film was removed just before punching the adhesive tape and then assembling of leadframes was carried out.

(Assembling of Leadframe)

The leadframe used in a semiconductor package as shown in FIG. 1 was assembled according to the following procedures.

(a) Punching of Adhesive Tape

The adhesive tape was subjected to punch dying in ring form by a mold.

(b) Pre-attachment of Adhesive Tape

A metal plane was placed on a hot plate, and the tape punched out in a ring form was pressed onto the plane so as to face the higher Tg side to the plane by means of a metal rod (4 kgf/cm²) to be pre-attached. The adhesion temperature in this stage is shown in Table 2 as Adhesion temperature of higher Tg side.

(c) Assembling of Leadframe

The metal plane to which the adhesive tape had been pre-attached in the above stage and a leadframe were positioned, and heated under pressure (4 kgf/cm²/1 second) on a hot plate heated to adhere the leadframe and the plane via the adhesive tape. The adhesion temperature in this stage is shown in Table 2 as Adhesion temperature of lower Tg side.

(Assembling of Semiconductor Package)

Thereafter, the produced leadframe was used to assemble a package according to the following procedures. The reason why the conditions of adhesion and curing were different at the time of assembling the leadframe is that the characteristics of the adhesive tapes are different from each other. Here, optimum conditions for each adhesive tape were selected and the adhesion was carried out based on such conditions.

(a) Die Bonding

A semiconductor chip was adhered to a plane portion with a silver paste for die bonding, which was then cured at 150° C. for 2 hours.

(b) Wire Bonding

Using a wire bonder, a wire pad on the semiconductor chip and a silver plated portion at the end of the inner lead were connected with a gold wire.

(c) Molding

Using an epoxy molding compound, transfer molding was carried out.

(d) Finishing Stage

Via stages of forming, dum cutting, solder plating on the outer leads, etc., the packaging was finished. (The Results of Evaluations of Adhesive Tapes and Semiconductor Packages)

(a) Adhesion strength

A 90° peel strength of 10 mm wide tape at room temperature was measured after the adhesive tape was adhered (taped) onto a copper plate under the same condition at assembling the leadframe. As the result, the adhesive tapes of Examples 1–40 were found to have a strength ranging from 35–50 g/10 mm, while the adhesive tapes of Comparative Examples 2 and 4 had the strength of 10–40 g/10mm which meant a large variation, and caused interfacial separation between the base film and the adhesive layer. The adhesive tapes of Comparative Examples 1 and 3 had the strength of 35–50 g/10 mm which we were allowable.

(b) Embedding of Lead pins

The state of lead pins burying in the adhesive tape was observed when the leadframe had been assembled. In the adhesive tape of Examples 1–40, the lead pins were embeded in the lower Tg layer but no embedding in the higher Tg layer was observed. In the adhesive tape of Comparative Examples 1 and 3, the state of embedding changed by each lead pin, some of which contacted with the metal plane.

(c) Evaluation of Semiconductor packages

The package obtained as described above were tested using the PCBT Test (Pressure Cooker Biased Test). This test was carried out at 5 volts of applied voltage at 121° C., at 2 atmospheres and at 100% relative humidity. As the result, the adhesive tapes of Examples 1–40 did not cause shorting even after 1,000 hours. In case of the adhesive tapes of Comparative Example 4, some of them caused interfacial separation between the base film and the adhesive layer, though no shorting took place.

As is clear from the results described above, in the case of the adhesive tapes of the present invention, the semiconductor package can be produced in a good manner. In contrast, the adhesive tapes of Comparative Examples are not suitable for manufacturing electronic parts because of causing troubles that the lead pins are embedded in the adhesive layers or the interfacial separation occurs.

I claim:

1. An adhesive tape for electronic parts comprising a first polyimide adhesive layer laminated to a second polyimide adhesive layer, wherein the first polyimide adhesive layer has a different glass transition temperature from the second polyimide adhesive layer and wherein the first polyimide adhesive layer and the second polyimide adhesive layer comprise a polyimide comprising: (i) 100–40% by mole of one repeat unit represented by formulas (1a) or (1b); (ii) 0–60% by mole of one repeat unit represented by formulas (2a) or (2b); and (iii) a number molecule weight of about 4000 to about 400,000; wherein (1a) and (1b) are:

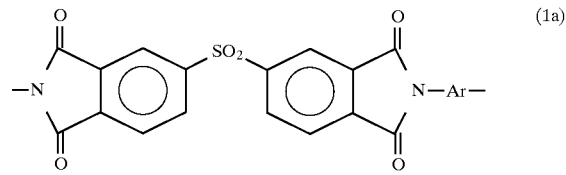

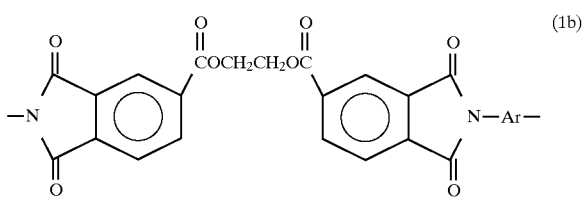

wherein Ar represents a divalent group selected form the following formulas containing aromatic rings:

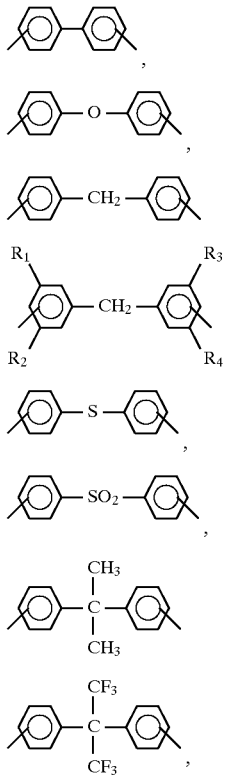

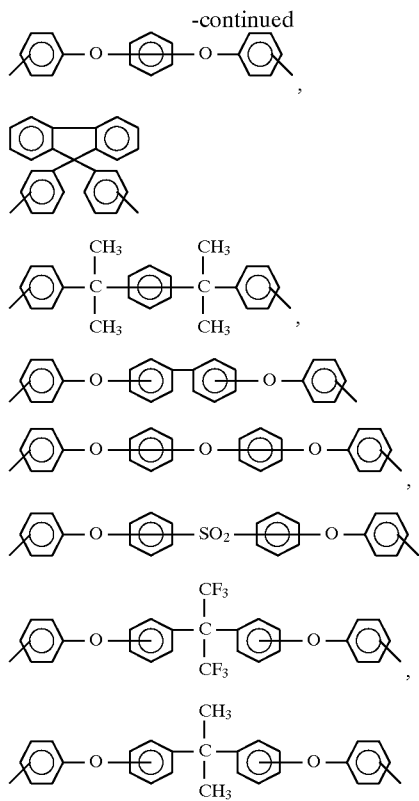

wherein $R_1$, $R_2$, $R_3$ and $R_4$ independently represent a hydrogen atom, an alkyl group having 1–4 carbon atoms or an alkoxy group having 1–4 carbon atoms, provided that $R_1$, $R_2$, $R_3$ and $R_4$ are not simultaneously hydrogen atoms; and wherein (2a) and (2b) are:

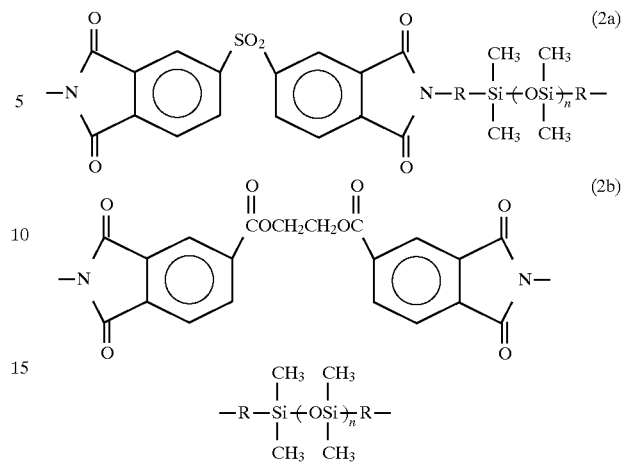

wherein R is an alkylene group having 1 to 10 carbon atoms or —$CH_2OC_6H_4$—, the methyl group of which attaches to Si, and n is an integer of 1 to 20.

2. The adhesive tape for electronics parts as claimed in claim 1, wherein the difference between the first polyimide adhesive layer and the second polyimide adhesive layer is at least 40° C.

3. The adhesive tape for electronic parts as claimed in claim 1, wherein at least one of the adhesive layers contains a filler having a particle size of not more than 1 μm in an amount of from 1 to 50% by weight.

4. The adhesive tape for electronic parts as claimed in claim 1, wherein a releasing film is provided on a surface of at least one of the adhesive layers.

* * * * *